United States Patent
Kobayashi et al.

[11] Patent Number: 6,077,403
[45] Date of Patent: Jun. 20, 2000

[54] SPUTTERING DEVICE AND SPUTTERING METHOD

[75] Inventors: Masahiko Kobayashi, Kanagawa-ken; Nobuyuki Takahashi, Sagamihara, both of Japan

[73] Assignee: Anelva Corporation, Fuchu, Japan

[21] Appl. No.: 09/027,217

[22] Filed: Feb. 20, 1998

[30] Foreign Application Priority Data

Jun. 6, 1997 [JP] Japan .................................... 9-165214

[51] Int. Cl.$^7$ ............................ C23C 14/35; C23C 14/34
[52] U.S. Cl. ............................... 204/192.12; 204/298.06; 204/298.08; 204/298.16
[58] Field of Search ................. 204/192.12, 298.06, 204/298.08, 298.11, 298.15, 298.16, 298.21

[56] References Cited

U.S. PATENT DOCUMENTS

| | | | |
|---|---|---|---|
| 3,530,057 | 9/1970 | Muly, Jr. | 204/298.06 |
| 4,853,102 | 8/1989 | Tateishi et al. | 204/298 |
| 4,871,433 | 10/1989 | Wagner et al. | 204/192.12 |
| 5,006,192 | 4/1991 | Deguchi | 156/345 |
| 5,006,219 | 4/1991 | Latz et al. | 204/298.16 |
| 5,026,470 | 6/1991 | Bonyhard et al. | 204/298.16 |
| 5,085,755 | 2/1992 | Setoyama et al. | 204/298.16 |
| 5,178,739 | 1/1993 | Barnes et al. | 204/192.12 |
| 5,215,638 | 6/1993 | Hausler | 204/192.12 |
| 5,308,417 | 5/1994 | Groechel et al. | 156/643 |
| 5,316,645 | 5/1994 | Yamagami et al. | 204/298.06 |
| 5,346,600 | 9/1994 | Nieh et al. | 204/192.3 |
| 5,439,574 | 8/1995 | Kobayashi et al. | 204/192.12 |
| 5,455,197 | 10/1995 | Ghanbari et al. | 437/192 |
| 5,478,459 | 12/1995 | Latz | 204/298.19 |
| 5,630,916 | 5/1997 | Gerrish et al. | 204/192.2 |
| 5,807,467 | 9/1998 | Givens et al. | 204/192.12 |
| 5,922,180 | 7/1999 | Hoshino | 204/298.06 |

FOREIGN PATENT DOCUMENTS

| | | | |
|---|---|---|---|
| 57-198635 | 12/1982 | Japan | H01L 21/31 |
| 1-111872 | 4/1989 | Japan | C23C 14/34 |

OTHER PUBLICATIONS

Magnetron Sputter Deposition for Interconnect Applications; S.M. Rossnagel; Conference Proceedings ULSI XI 1996; Materials Research Society 1996; pp. 227–232.

Ionized Magnetron Sputtering for Lining and Filling Trenches and Vias; S.M. Rossnagel; Feb. 1996; Semiconductor International; pp. 99–100 and 102.

*Primary Examiner*—Nam Nguyen
*Assistant Examiner*—Steven H. VerSteeg
*Attorney, Agent, or Firm*—Burns, Doane, Swecker & Mathis, LLP

[57] ABSTRACT

A sputtering device includes a chamber equipped with an exhaust system. A sputtering power source applies specific high frequency electric power to the target. A supplemental electrode is provided so that it surrounds the flight path of sputter particles between the target and a substrate. The supplemental electrode is either maintained at a floating potential so that it is capacitively coupled with the target to which high frequency electric power has been applied, in addition, high frequency electric power of the same frequency may be applied directly to the supplemental electrode. A plasma P' is formed on the inside of the supplemental electrode, and the sputter particles released from the target are ionized. An extraction-use electric field is set up by an electric field establishment means, and is directed perpendicularly to the substrate. This construction and its associated method allow a film to be formed with good bottom coverage on the inner surfaces of holes whose aspect ratio is over 4.

22 Claims, 6 Drawing Sheets

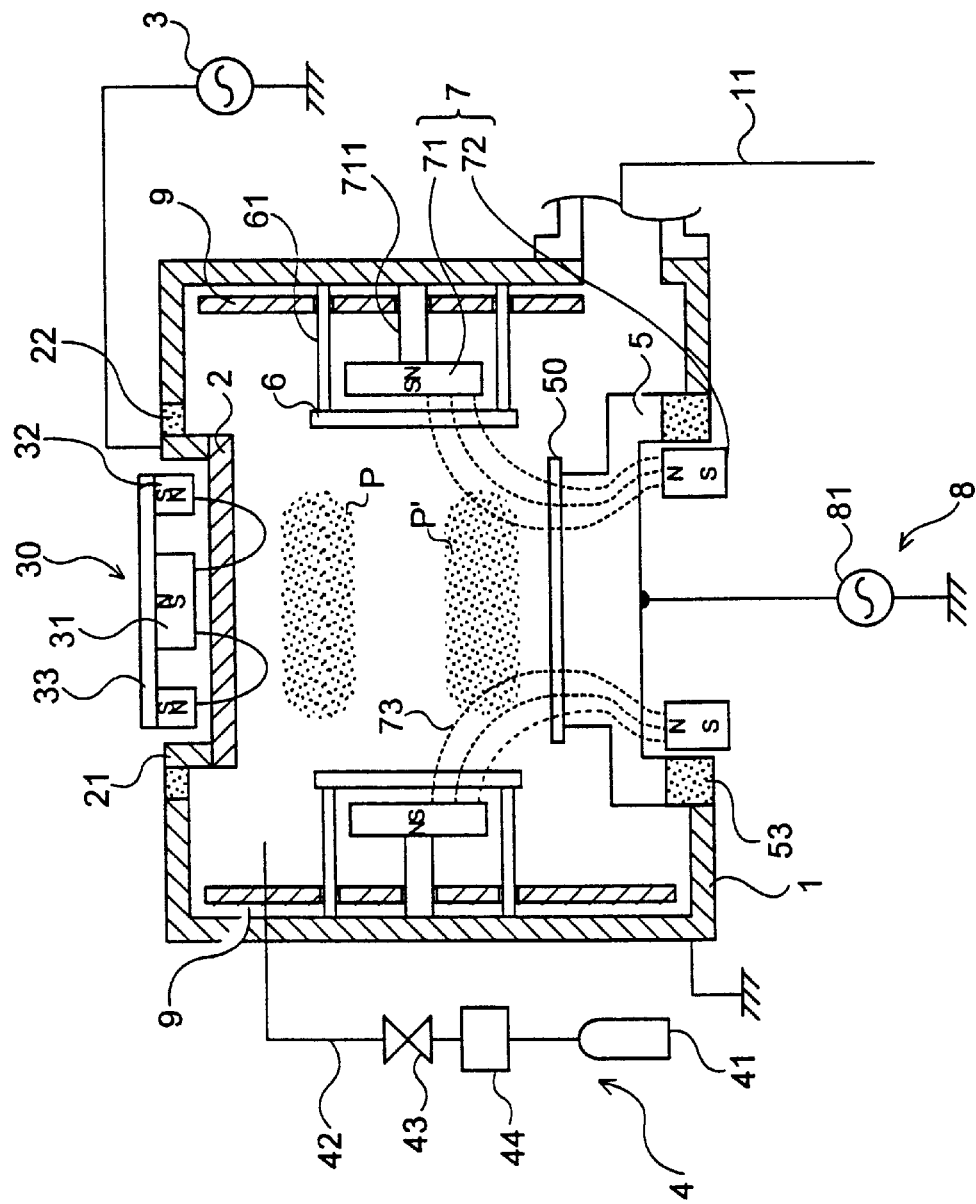

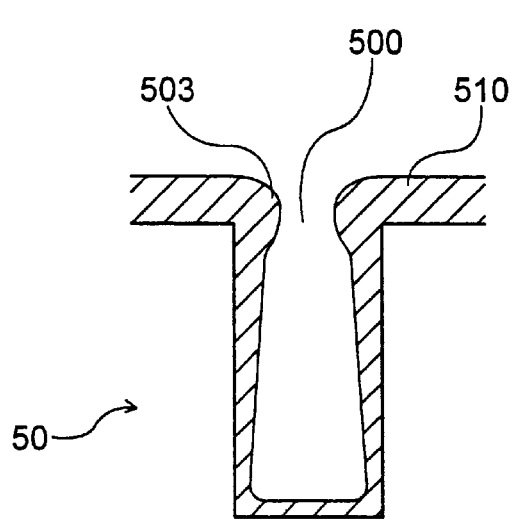
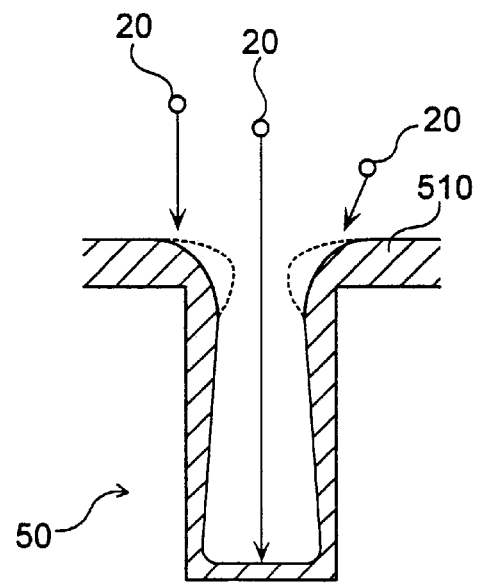
Fig.2(a) Prior Art
Fig.2(b)

SPUTTERING DEVICE AND SPUTTERING METHOD

This application claim s priority under 35 U.S.C. §§119 and/or 365 to Appln. No. 9-165214 filed in Japan on Jun. 6, 1997 the entire content of which is hereby incorporated by reference.

BACKGROUND OF THE INVENTION

1. Field of the Invention

The present invention relates to a sputtering device used in the fabrication of various types of semiconductor articles. More particularly, it relates to a sputtering device equipped to ionize sputter particles.

2. Related Art

Various types of memory and logic devices have wiring patterns and barrier films formed by sputtering thin film coatings on a surface of a semiconductor substrate material. There has recently been a great need for efficient coating of the inner peripheral surfaces of holes formed in such substrates.

For example, a CMOS-FET (field effect transistor), which is commonly used in a DRAM, employs a structure that prevents cross-contamination between the contact wiring layer and the diffusion layer by providing a barrier film on the inner surfaces of contact holes provided in the diffusion layer.

In another example, through holes are provided in a substrate which is used for the wiring of memory cells. A multilayer wiring structure is embedded inside these through holes in order to link a lower wiring layer with an upper wiring layer. These through holes also lead to an interlayer insulation film. Here again, a structure is adopted in which a barrier film is produced inside the through holes to prevent cross-contamination of the various wiring and insulating patterns.

Due to the increasing demand for integration in semiconductor devices, the ratio of the hole depth to the size of the hole opening (hereafter referred to as the "aspect ratio") has been steadily rising over the years. For example, a typical aspect ratio of holes in a 64 megabit DRAM device is about 4, while a typical aspect ratio of holes in a 256 megabit DRAM is about 5 to 6.

In the case of a barrier film, a thin film must be built up on the bottom of the hole. For holes with a high aspect ratio, it is difficult to deposit a film of sufficient thickness on the bottom of the hole. As shown in FIG. 2a, when a thin film 510 is deposited inside a fine hole 500 formed in the surface of the substrate 50, there is a tendency for the thin film 510 to build up and create a bulge around the edge 503 of the opening of the hole 500. The thin film 510 that makes up this bulge portion is called an "overhang. " The formation of this overhang raises the apparent aspect ratio through a narrowing of the opening to the hole 500. The amount of sputter atoms that reach the inside of the hole 500 decreases, and the bottom coverage is diminished.

A decrease in the bottom coverage can lead to a thinner barrier film at the bottom of the hole and to critical flaws in the device characteristics, such as junction leakage. Typically, the rate at which the bottom of the hole is coated, i.e., the thickness of deposited coating per unit of time should be around 10% to 15% of the rate at which the peripheral surface of the hole is coated in order to provide a bottom coating of sufficient thickness.

Collimation sputtering and low-pressure, long-distance sputtering processes have been utilized to increase the bottom coverage.

Collimation sputtering involves using a plate (collimator) in which numerous holes have been made in the direction perpendicular to the substrate, and providing this plate between the target and the substrate. Collimation sputtering is a process in which only those sputter particles (usually sputter atoms) that fly more or less perpendicular to the substrate are selectively allowed to reach the substrate. A problem with collimation sputtering is that sputter particles accumulate on the collimator portion, and the resulting loss of material decreases the deposition rate of the sputter particles. Because of these problems, collimation sputtering is only used for mass-produced products of the 16-megabit class in which the aspect ratio is up to about 3.

Low-pressure, long-distance sputtering involves lengthening the distance between the target and substrate (usually about 3 to 5 times farther) so that the sputter particles that fly more or less perpendicular to the substrate are the particles that are most likely to land on the substrate. Lowering the pressure more than usual (about 0.8 mTorr or less) has the effect of increasing the mean free path of the sputter particles. The mean free path is generally defined as the average distance the particles travel before they collide with other particles or ions. By reducing pressure, turbulence of the sputter particles is reduced and the mean free path increases, resulting in more sputter particles reaching the substrate. A problem with low-pressure, long-distance sputtering is that since the pressure is lowered and the distance between the target and the substrate is lengthened, there is a fundamental decrease in the deposition rate. Therefore, long-distance sputtering is limited to devices up to an aspect ratio up to about 4.

OBJECTS AND SUMMARY

An object of the present invention is to allow a film to be deposited with good bottom coverage on the inner surfaces of holes with relatively high aspect ratios, including, but not limited to, holes with aspect ratios of 4 or higher.

Another object of the present intention is to provide a device for coating a substrate. In order to achieve these and other objectives, the present invention includes a sputtering power source applied to a target and a supplemental electrode that surrounds the flight path of the sputter particles between the target and a substrate. This supplemental electrode is spaced from the target so that a floating potential is formed. The supplemental electrode is thereby capacitively coupled with the target. A plasma is formed on the inside of the supplemental electrode by the high frequency electric power applied to the target. The ionizing sputtering device may also include a sputter chamber equipped with an exhaust system, a gas introduction means for introducing a gas into the sputter chamber, a substrate holder for holding a substrate in the incident position of the sputter particles released from the target by sputtering.

BRIEF DESCRIPTION OF THE DRAWINGS

FIG. 1 is a view of the structure of the sputtering apparatus of a first embodiment of the invention;

FIG. 2(a) is a simplified cross-sectional view of overhang build-up typically associated with conventional coating techniques;

FIG. 2(b) is a simplified cross-sectional view of the built-up thin film, and is used to illustrate the action of the ionized sputter particles produced by the present invention;

DETAILED DESCRIPTION OF THE PREFERRED EMBODIMENTS

Figure 3:
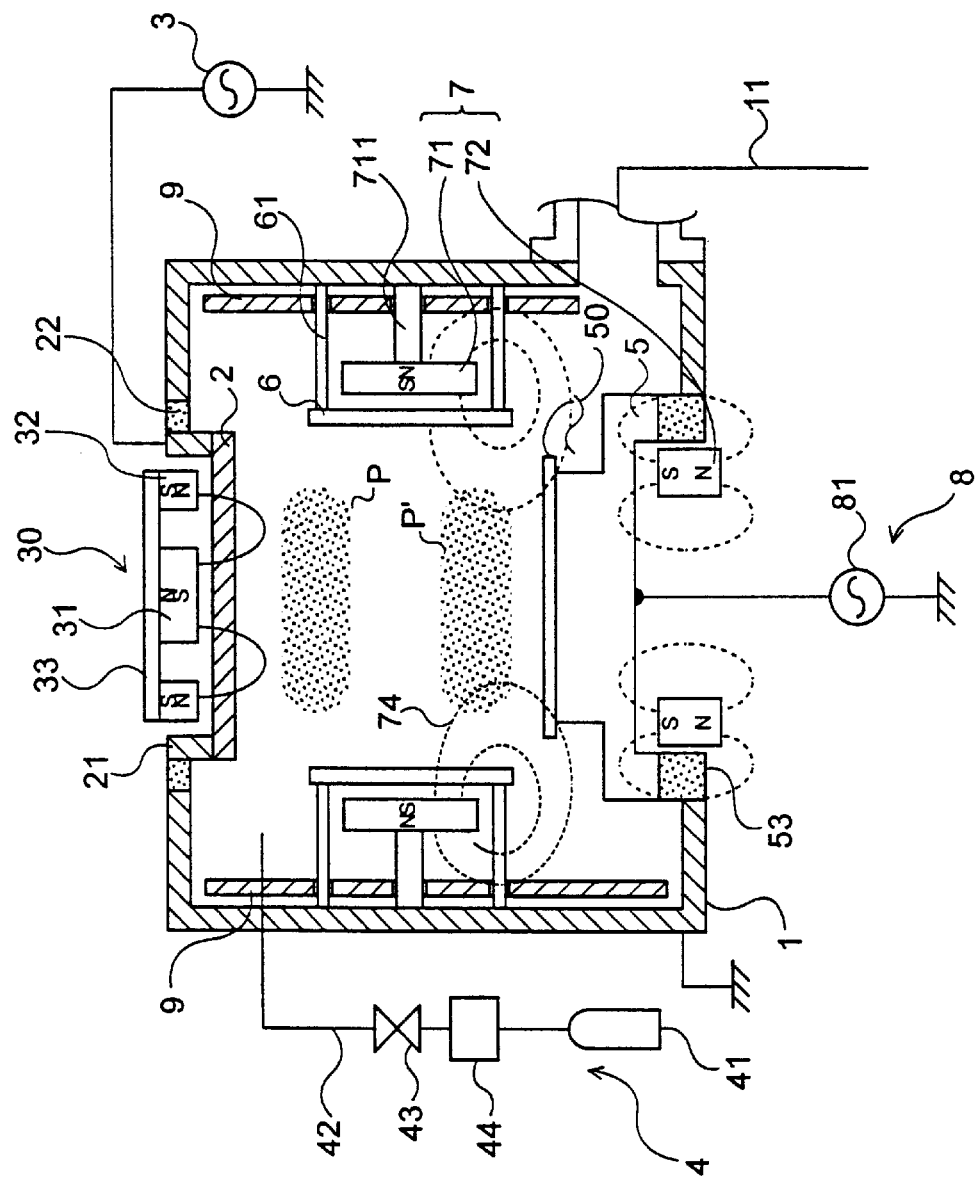
FIG. 3 is a view of a modification of the sputtering apparatus of FIG. 1.

A first embodiment of a sputtering device of the present invention is shown in FIG. 1. The device has a sputter chamber 1 equipped with a vacuum pump system 11. The sputter chamber 1 has a target 2 located inside the chamber, a sputtering power source 3 that sputters the target 2, a gas introduction means 4 for introducing the desired gas into the sputter chamber 1, and a supplemental electrode 6. The sputter particles released from the target 2 are directed at a substrate 50 held on a substrate holder 5.

The sputter chamber 1 is an airtight vessel equipped with a gate valve (not shown). This sputter chamber 1 is made of a metal such as stainless steel, and is electrically grounded.

The vacuum pump system 11 is a multi-stage vacuum pump system furnished with a turbo molecular pump and a diffusion pump. The vacuum pump 11 is capable of pumping out the inside of the sputter chamber 1 down to about $10^{-8}$ Torr. The vacuum pump system 11 is equipped with a pumping speed adjuster (not shown), such as a variable orifice, which allows the pumping speed to be adjusted.

The film deposition pressure is an important condition in terms of favorably obtaining the effect of the ionized sputter particles. If the film deposition pressure drops below 10 mTorr, it may be difficult to ionize the sputter particles sufficiently. If the film deposition pressure exceeds 100 mTorr, the sputter particles will be sufficiently ionized, but the ionized sputter particles will be scattered by the numerous gas molecules present along the flight path of the sputter particles, which is a problem in that not enough of the particles may reach the substrate 50. Therefore, it is generally preferable for the film deposition pressure to be between 10 and 100 mTorr.

It is also preferable that the above-mentioned film deposition pressure condition be optimized due to the relationship between pressure and the mean free path of the ionized sputter particles. In order for the action of the ionized sputter particles to be most effective, the sputter particles should collide with electrons or ions a high percentage of the time after they are released from the target 2 until they reach the substrate 50. It is important that the mean free path of the sputter particles be sufficiently shortened compared to the distance between the target 2 and the substrate 50. It should be noted that the mean free path of the sputter particles is similar to the mean free path of process gas particles due to frequent collisions between the two.

In the example of this embodiment, if the distance between the target 2 and the substrate 50 is about 120 mm, and the film deposition pressure is 30 mTorr, then the mean free path is about 5 mm or less. The length of this mean free path is sufficiently less than the distance between the target 2 and the substrate 50, which promotes ionization through frequent collisions of the sputter particles with the ions.

The target 2 is in the form of a disk that is 6 mm thick and about 300 mm in diameter.

The target 2 is attached to the sputter chamber 1 via a metal target holder 21 and an insulator 22.

A magnet assembly 30 is provided behind the target 2 so that magnetron sputtering can be performed. The magnet assembly 30 consists of a center magnet 31, a peripheral magnet 32 that surrounds this center magnet 31, and a disk-shaped yoke 33 that ties the center magnet 31 to the peripheral magnet 32. The magnets 31 and 32 are both permanent magnets, but they can instead comprise electromagnets.

The sputtering power source 3 is structured so as to apply constant, high frequency waves to the target 2. In specific terms, the sputtering power source 3 supplies high frequency waves with a frequency of about 13.56 MHz and a power of about 6 kW. A regulator (not shown) is provided between the sputtering power source 3 and the target 2, which allows impedance matching to be performed.

An electric field establishment means 8 is provided for setting up an electric field perpendicular to the substrate 50 in order to pull ions from the plasma P' formed on the inside of the supplemental electrode 6, and direct them at the substrate 50. The electric field establishment means 8 comprises a substrate-biasing high frequency power source 81 that applies a high frequency voltage to the substrate 50, and thereby imparts a self-bias voltage to the substrate 50 through the action of the high frequency waves and the plasma P'.

When a high frequency voltage is applied to the substrate 50 by the substrate-biasing high frequency power source 81, the charged particles in the plasma P' are periodically attracted to the surface of the substrate 50. Electrons, with their higher degree of mobility, are attracted to the surface of the substrate 50 in greater number than positive ions, as a result of which the surface of the substrate 50 is in the same state as if it were biased to a negative potential. In the case of the substrate-biasing high frequency power source 81 mentioned above, a bias voltage of about −100 V can be imparted on average to the substrate 50.

In the state in which the above-mentioned substrate bias voltage has been imparted, an electric field having a potential gradient that drops toward the substrate 50 is set up between the plasma P' and the substrate 50 (hereafter referred to as an extraction-use electric field). This extraction-use electric field is an electric field that faces perpendicular to the substrate 50. The ionized sputter particles 20 tend to be guided by this extraction-use electric field and to move perpendicular to the substrate 50. The ionized sputter particles 20 readily reach the bottom of the deep hole 500, and this also contributes to an increase in bottom coverage. For example, the bottom of a hole having an aspect ratio of approximately 4 can be coated at a rate of about 50% relative to the rate at which the peripheral surfaces of the hole are covered under the following conditions: the high-frequency electric power supplied to the target 2 is set at approximately 13.56 MHZ and 6 KW, the power supplied to the substrate by power supply 81 is 13.56 MHZ and 200 W, and the pressure inside the sputter chamber 1 is set at 30 mTorr.

The gas introduction means 4 includes a gas cylinder 41 filled with argon or another sputtering discharge gas, a tube 42 that links the argon gas introduction system 41 and the putter chamber 1, and a valve 43 or flux adjuster 44 provided to the tube 42.

The substrate holder 5 is airtightly attached to the sputter chamber 1 via an insulator 53, and holds the substrate 50 parallel to the target 2. An electrostatic chucking mechanism (not shown) that attracts the substrate 50 through static electricity is provided to the substrate holder 5. This electrostatic chucking mechanism comprises chucking electrodes provided inside the substrate holder 5, and applies a direct current voltage to the chucking electrodes. A heating mechanism (not shown) that heats the substrate 50 during film deposition so as to make the film deposition more efficient is provided inside the substrate holder 5.

One of the features of the device in this embodiment is the provision of a supplemental electrode 6 that surrounds the flight path of the sputter particles between the target 2 and the substrate 50.

The supplemental electrode 6 in the embodiment illustrated in FIG. 1 is cylindrical, and is provided coaxially with the target 2 and the substrate 50. The cylindrical supplemental electrode 6 may have a wall thickness of about 2 mm, an inside diameter of about 350 to 400 mm, and a height of about 50 mm.

The supplemental electrode 6 is held in the sputter chamber 1 via an insulator 61. The supplemental electrode 6 has a floating potential with respect to the plasma P formed by the sputter discharge.

The supplemental electrode 6 is designed to be capacitively coupled with the target 2 via the capacity of the discharge space during the formation of the plasma P when high frequency waves are applied to the target 2 by the sputtering power source. The potential of the supplemental electrode 6 changes periodically according to the periodic changes in the potential of the target 2, and a high frequency electric field is set up on the inside of the supplemental electrode 6. This high frequency electric field results in the supplemental formation of a plasma P' inside the supplemental electrode 6.

There are instances when the plasma P formed by the sputter discharge and the plasma P' formed by the action of the supplemental electrode 6 are spatially continuous, and instances when the two are apparently indistinguishable. There are also cases when the plasma P formed by sputter discharge seems to diffuse to the inside of the supplemental electrode 6. There is essentially no difference whether the plasma P diffuses or the separately formed plasma P' is continuous with the plasma P. The action of the supplemental electrode 6 appears to be the reason a plasma of sufficient density is maintained at the diffusion site, even when the plasma P diffuses. This is essentially the same as if a separate plasma were formed by the supplemental electrode 6.

A magnetic field establishment means 7 is provided for setting up a magnetic field in order to trap the plasma on the inside of the supplemental electrode 6. The magnetic field establishment means 7 comprises a first magnet 71 positioned inside the sputter chamber 1 so as to surround the outside of the supplemental electrode 6, and a second magnet 72 positioned beneath the substrate holder 5.

The first magnet 71 is a cylindrical permanent magnet positioned coaxially with the supplemental electrode 6, and is such that its magnetic poles are different on the inner and outer surfaces. This first magnet 71 is attached to the sputter chamber 1 via a metal holding member 711, and therefore has electrically grounded potential.

The size of the first magnet 71 varies with the size of the target 2 and the substrate 50. For example, when a target 2 with a diameter of 300 mm is used, the first magnet 71 may have an inside diameter of about 350 mm, an outside diameter of about 400 mm, and a height of about 40 mm. The first magnet 71 should have a strength of about 500 gauss at the surface on the inner side.

The second magnet 72 is cylindrical permanent magnet that is smaller in diameter than the substrate holder 5. The second magnet 72 is positioned concentrically with the first magnet 71. With the second magnet 72, the magnetic poles are different on the upper and lower surfaces. The size of the second magnet 72 varies with the size of the substrate 50. When a substrate with a diameter of 8 inches is used, the second magnet 72 may have an inside diameter of approximately 140 mm, an outside diameter of approximately 180 mm, and a height of approximately 30 mm. The strength of the second magnet 72 should be about 100 gauss at the surface on the upper end.

The magnetic pole of the inner surface of the first magnet 71 is opposite from the magnetic pole of the upper end of the second magnet 72, and the magnetic pole of the outer surface of the first magnet 71 is opposite from the magnetic pole of the lower end of the second magnet 72. The lines of magnetic force 73 shown in FIG. 1 are thus established in the sputter chamber 1.

The above-mentioned magnetic field establishment means 7 forms a high-density plasma P' on the inside of the supplemental electrode 6, and prevents the diffusion of the plasma P', primarily by trapping electrons in the plasma. If a magnetic field is set up within the plasma P' electrons in the plasma P' will be trapped by the lines of magnetic force, thereby preventing diffusion. As a result, the plasma density is higher. In this embodiment, the lines of magnetic force 73 shown in FIG. 1 are set up. This magnetic force 73 is particularly effective in preventing the diffusion of the plasma P' toward the region on the outside of the substrate holder 5, so a high-density plasma is maintained on the inside of the supplemental electrode 6.

An anti-adhesion shield 9 that prevents the sputter particles from adhering to unnecessary places is provided on the inside of the walls of the sputter chamber 1. If the sputter particles adhere to the walls of the sputter chamber 1, a thin film will build up over time. Once this thin film reaches a certain thickness, it flakes off due to internal stress. The film flakes that come off become dust particles that float in the sputter chamber 1. When these dust particles reach the substrate 50, they produce defects such as local film thickness irregularities. Therefore, the inside of the walls of the sputter chamber 1 are covered with the anti-adhesion shield 9 to prevent the sputter particles from adhering to the walls. The shape of the anti-adhesion shield 9 conforms to the shape of the walls of the sputter chamber 1. The anti-adhesion shield 9 is detachably provided to the sputter chamber 1. Irregularities that prevent the built-up thin film from peeling off are provided to the surface of the anti-adhesion shield 9, and once the thin film has adhered in a thickness great enough for it to peel off, the anti-adhesion shield 9 is removed from the sputter chamber 1 and replaced with a new one.

The device of the invention efficiently ionizes the sputter particles and directs them perpendicularly at the substrate 50, so a film is deposited with high bottom coverage for holes with a high aspect ratio. The device makes use of part of the electric power put into the target 2 to form the plasma P' used for ionization. Therefore, the device of this embodiment needs no separate power supply, which is advantageous from a cost standpoint. It is surmised that under the above conditions, about 30% of the high frequency electric power applied to the target 2 propagates to the supplemental electrode 6.

In the device of the above embodiment, the supplemental electrode 6 is exposed to the plasma P', so there is the danger that the supplemental electrode 6 will itself be sputtered. The problem with the supplemental electrode 6 being sputtered is that the sputtered supplemental electrode 6 material reaches the substrate 50 and fouls the substrate 50.

To solve this problem, the supplemental electrode 6 should be formed from the same or a similar material as the target 2. When the target 2 is made from titanium, the supplemental electrode 6 is formed from titanium or a titanium alloy. Here, a material similar to the material of the target means a material that will not foul or contaminate the substrate.

The surface of the supplemental electrode 6 may be covered with a material the same as that of the target 2. When the target 2 is made of titanium, a titanium film is deposited ahead of time in a thickness of about 100μ on the surface of the supplemental electrode 6. A covering such as this can be applied by electroplating or sputtering. As the number of film deposition processing increases and the underlying material is exposed, the supplemental electrode 6 is replaced with a new one.

The surface of the supplemental electrode 6 may be subjected to a surface treatment for plasma resistance, such as an alumite treatment, so that it will not be sputtered by the plasma P'.

As previously mentioned in connection with the earlier discussion of the related art, FIG. 2a illustrates formation of an overhang which is often associated with conventional sputtering techniques.

As shown in FIG. 2b, when the ionized sputter particles 20 reach the substrate 50, they re-sputter and break up the thin film 510 at the overhang portion. The ionized sputter particles 20 act so as to knock the overhang portion of the thin film 510 into the hole 500. The ionized sputter particles 20 prevent the opening to the hole 500 from narrowing, and promote film accumulation on the bottom of the hole 500, the result of which is enhanced bottom coverage. This re-sputtering of the overhang can be produced not only by the ionized sputter particles 20, but also by the ions of process gas introduced for sputter discharge.

In the above-mentioned first embodiment, the magnetic field establishment means 7 sets up lines of magnetic force so as to link the first magnet 71 and the second magnet 72 and which extends from the plasma P' to the substrate 50. This magnetic field establishment means 7 is suited for use in the extraction of electrons or ions from a plasma. When electron collision with the substrate 50 is a problem, the magnetic field establishment means 7 may be modified as follows.

FIG. 3 is a simplified cross-sectional view of another embodiment of the present invention. In this embodiment the structure of the magnetic field establishment means 7 in the device of FIG. 1 has been modified. As shown in FIG. 3, the pole at the inner surface of the first magnet 71 and the pole at the upper end of the second magnet 72 are both the same. For example, in FIG. 3 these poles that face each other are both an "S" pole. In addition, the pole at and the outer surface of the first magnet 71 and the pole at the lower end of the second magnet 72 are both the same For example, in FIG. 3 these poles that face each other are both an "S" pole. The resulting lines of magnetic force 74 shown in FIG. 3 are set up in the sputter chamber 1.

With the magnetic field configuration shown in FIG. 3, the lines of magnetic force going from the plasma P' to the substrate 50 are smaller, so the effect of electron or ion extraction from the plasma is also smaller than that in FIG. 1. However, a corresponding decrease in the problem of the fouling of the substrate 50 by electron impact is achieved by the modified magnetic field.

Figure 4:
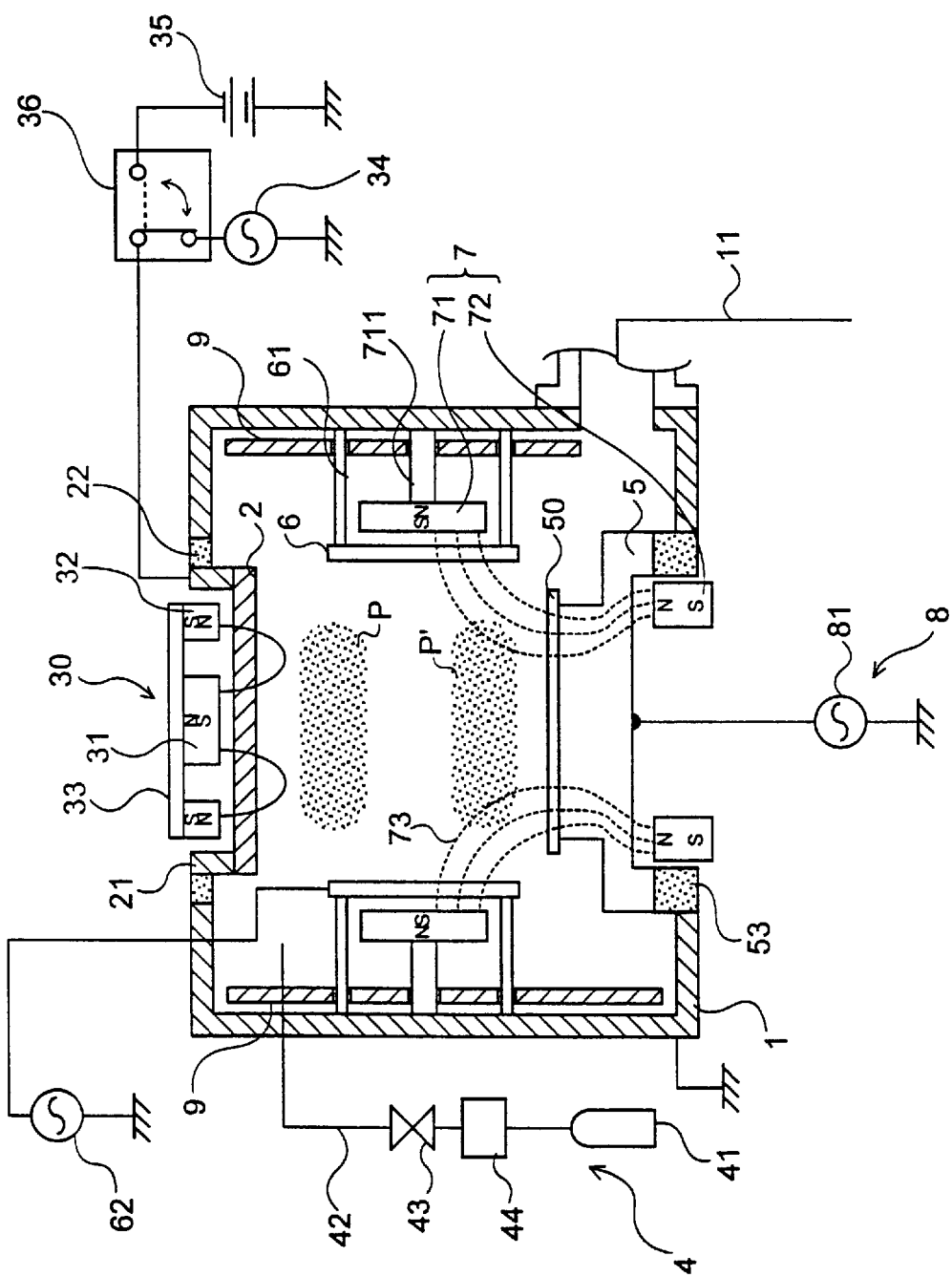
FIG. 4 is a view of another modification of the sputtering apparatus of FIG. 1.

FIG. 4 is a simplified cross-sectional view of another embodiment of the sputtering device of the present invention.

The device in this embodiment differs from the device in the first embodiment in that high frequency electric power is applied to the supplemental electrode 6. A supplemental high frequency power source 62 is connected to the supplemental electrode 6. This supplemental high frequency power source 62 has a frequency of 400 kHz and an output of about 500 W.

The supplemental high frequency power source 62 is connected to the supplemental electrode 6 by a transmission line 63 such as a coaxial cable that airtightly passes through the sputter chamber 1 via an insulator (not shown). The transmission line 63 is connected to the upper end surface of the supplemental electrode 6, but may instead be connected to the outer side surface or elsewhere.

The insulator 61 that holds the supplemental electrode 6 is in the form of a tube, and can have a structure in which a coaxial cable is provided to the interior to connect it to the supplemental electrode 6, or a structure in which the supplemental electrode 6 is held by a coaxial tube that is capable of propagating high frequency waves. When a coaxial tube is fixed to the sputter chamber 1, the coaxial tube and the sputter chamber 1 are insulated.

The high frequency voltage and the negative, direct current voltage can be switched in their application to the target 2. The target 2 is connected to a first sputtering power source 34 that applies high frequency electric power, and to a second sputtering power source 35 that applies negative, direct current voltage. One or the other of these can be selected by a switch 36.

The first sputtering power source 34 that applies high frequency electric power can be the same as the sputtering power source 3 used in the first embodiment given above. The first sputtering power source 34 and the supplemental high frequency power source 62 should be designed to apply high frequency waves of the same frequency. The second sputtering power source 35 is one that applies a voltage of about −600 V.

When the first sputtering power source 34 is used to apply a high frequency voltage, the target 2 and the supplemental electrode 6 are capacitively coupled via the capacity in the discharge space, and the plasma P' is efficiently formed on the inside of the supplemental electrode 6. This embodiment results in higher costs since the supplemental high frequency power source 62 is required, but the plasma P' can be formed at a higher density. As a result, there is an increase in the sputter particle ionization efficiency. Under the same pressure conditions as in the first embodiment, a bottom coverage of about 60% is obtained for a hole with an aspect ratio of 4.

Figure 5:
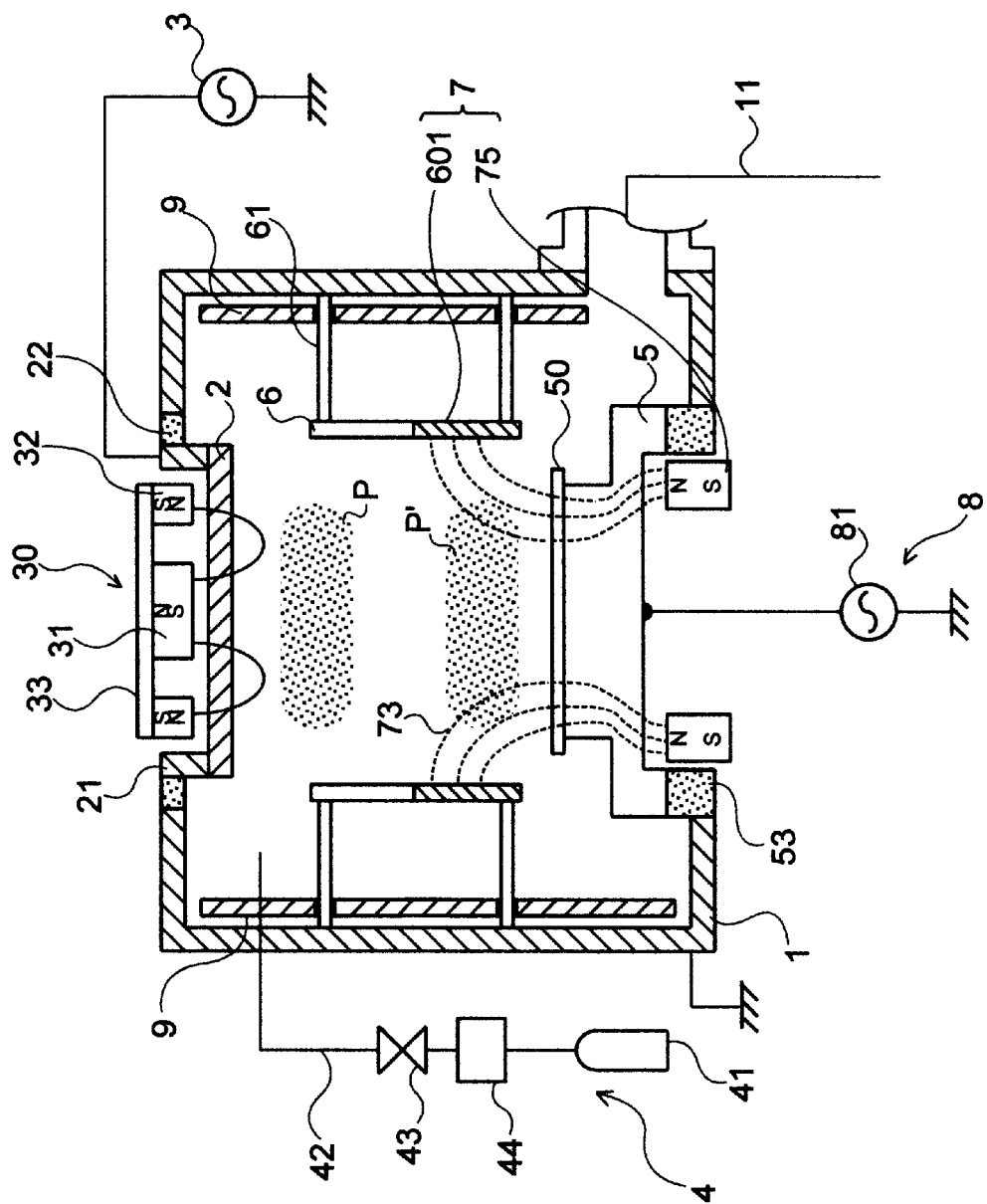
FIG. 5 is a view of another modification of the sputtering apparatus of FIG. 1.

FIG. 5 is a simplified cross-sectional view of another embodiment of the sputtering device of the present intention.

The device in this embodiment differs from the devices in the above embodiments in that the supplemental electrode 6 makes up part of the magnetic field establishment means 7. Approximately one half (portion 601) of the substrate holder 5 side of the supplemental electrode 6 is formed from a magnetic material (hereinafter referred to as the magnetic body). The magnetic body 601 is formed from magnetic stainless steel, or from iron that has undergone a nickel plating anti-corrosion treatment.

A supplemental magnet 75 that is the same as the second magnet 72 in the first embodiment is provided beneath the substrate holder 5. The magnetic body 601 of the supplemental electrode 6 is magnetized over time as the magnetic path of a magnetic field is formed by this supplemental magnet, and constitutes a part of the magnetic field establishment means 7 along with the second magnet 75.

Again in this embodiment, just as in the situation shown in FIG. 1, the plasma P' is trapped inside the supplemental electrode 6, so the plasma P' is obtained with a higher density, and the sputter particle ionization rate is higher. The cost is also lower since the supplemental electrode 6 doubles as part of the magnetic field establishment means 7.

As described above, part of the supplemental electrode 6 may be formed from a magnetic body. Alternatively, the entire supplemental electrode 6 may be formed of the magnetic material. The magnetic body may be either a permanent magnet or an electromagnet.

Figure 6:
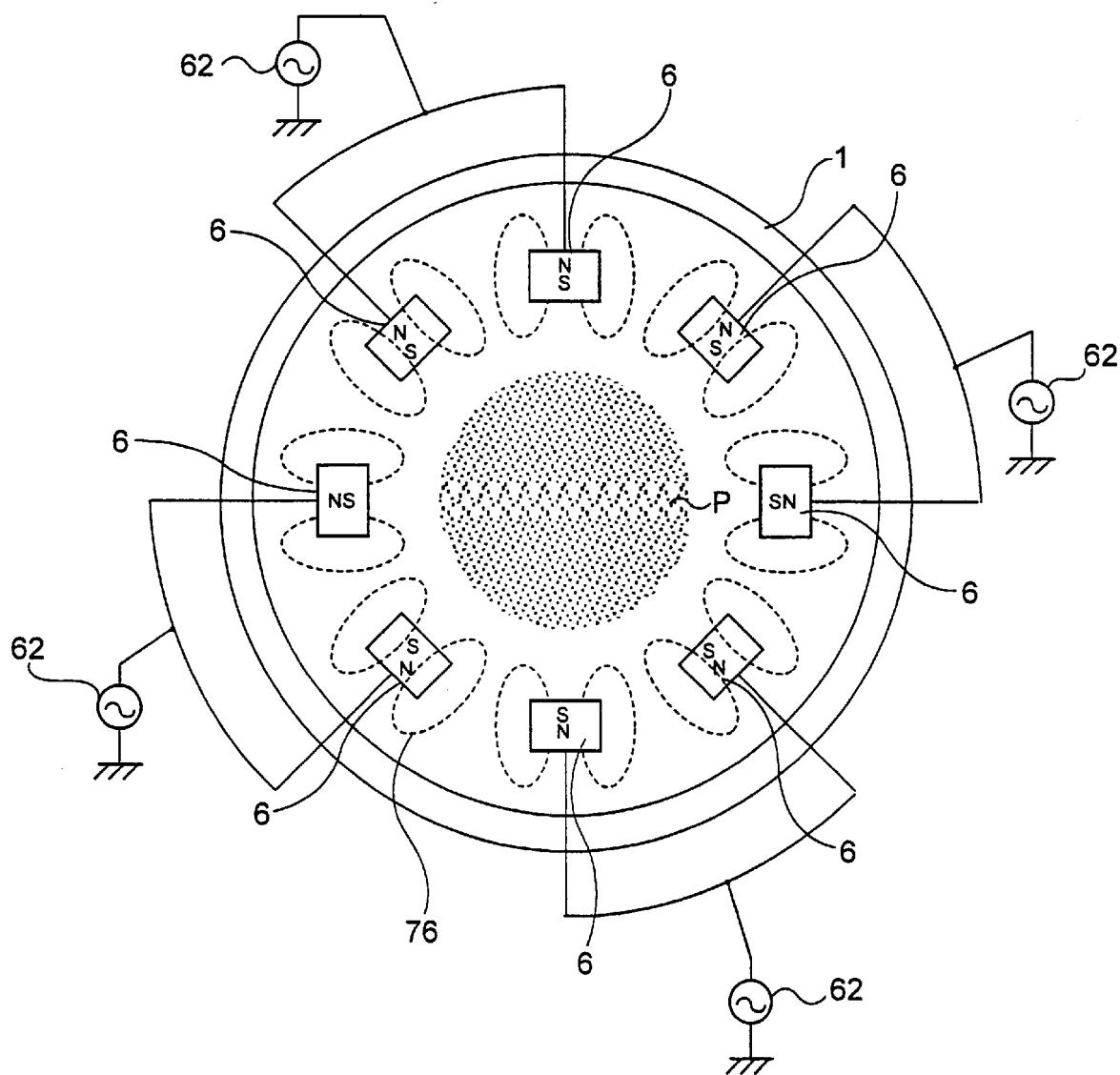
FIG. 6 is a view of another modification of the sputtering apparatus of FIG. 1.

FIG. 6 is a simplified plan view of another embodiment of the structure of the sputtering device of the present intention.

This embodiment differs from the previous embodiments in that all of the magnetic field establishment means 7 is formed by the supplemental electrode 6. The supplemental electrode 6 in this embodiment is defined by a plurality of angular rod-shaped members that are longer in the height direction of the sputter chamber 1. As shown in FIG. 6, these members are provided at equal intervals around the periphery. Each member of the supplemental electrode 6 is formed from a magnetized magnetic body.

The surface on the inside of each member of the supplemental electrode 6 is the same magnetic pole (such as the S pole), and the surface on the outside of each member of the supplemental electrode 6 is the other magnetic pole (such as the N pole).

The cusp magnetic field shown in FIG. 5 is formed circularly on the inside of each member of the supplemental electrode 6. In this cusp magnetic field, the plasma P' has difficulty diffusing in the direction that crosses the lines of magnetic force 76, so the plasma P' is trapped on the inside of the supplemental electrodes 6 as a result of which a higher-density plasma P' is formed.

The ionization of the sputter particles is performed efficiently by this cusp magnetic field. Since the plasma P' is prevented from diffusing toward the supplemental electrode 6, sputtering or fouling of the supplemental electrode 6 by the plasma P', and heating by electron impact are suppressed.

As shown in FIG. 6, one supplemental high frequency power source 62 is provided for every two supplemental electrode members 6, and a splitter is used to branch the transmission line and supply high frequency electric power to each of the supplemental electrode members 6. A dedicated supplemental high frequency power source 62 may be provided to each supplemental electrode member 6, or a single supplemental high frequency power source 62 may be branched and high frequency electric power supplied to each supplemental electrode member 6. If the spacing of the supplemental electrode members 6 is adjusted so that high frequency waves are coupled by adjacent supplemental electrode members 6, then only one power supply site will be needed, so branching will be unnecessary. In this case, it is even more favorable if the high frequency waves resonate in the supplemental electrode members 6.

The ionizing sputter device of the present invention can be utilized in the fabrication of various semiconductor devices, as well as liquid crystal displays and various other electronic products.

Method of Operation

A method of operating the sputtering device of this invention will now be described through reference to the drawing figures.

The substrate 50 is conveyed through a gate valve (not shown) and into the sputter chamber 1, where it is placed on the substrate holder 5. The inside of the sputter chamber 1 has already been pumped down to about 10–9 Torr. After the substrate 50 is in place, the gas introduction means 4 is actuated, and a process gas such as argon is introduced at a constant flux rate.

The pumping speed adjuster of the vacuum pump system 11 is controlled so as to maintain the inside of the sputter chamber 1 at about 20 to 40 mTorr, and the sputtering power source 3 is actuated in this state. The substrate-biasing high frequency power source 81 is also actuated at the same time.

A constant, high frequency voltage is imparted to the target 2 by the sputtering power source 3, which produces a magnetron sputter discharge. This magnetron sputter discharge forms a plasma P beneath the target 2. The target 2 and the supplemental electrode 6 are capacitively coupled via the capacity of the discharge space, and the high frequency waves applied to the target 2 propagate to the supplemental electrode 6. As a result, the plasma P' is formed on the inside of the supplemental electrode 6.

A substrate-biasing voltage is imparted to the substrate 50 by the substrate-biasing high frequency power source 81. As a result, an extraction-use electric field is set up between the plasma P' and the substrate 50.

The sputter particles released from the target 2 reach the substrate 50, where they build up a thin film composed of the material of the target 2. Once the thin film reaches the desired thickness, the sputtering power source 3, the substrate-biasing high frequency power source 81, and the gas introduction system 4 are turned off. After the inside of the sputter chamber 1 has been pumped out once again, the substrate 50 is taken out of the sputter chamber 1.

When a barrier film is to be produced, a titanium target 2 is used, and argon is at first introduced as the process gas to form a titanium thin film. After this, nitrogen gas is introduced as the process gas, and a reaction between the titanium and the nitrogen is induced. The result is a barrier film in which a titanium nitride thin film is laminated over a titanium thin film.

Most of the sputter particles released from the target 2 become ionized sputter particles over the course of their passage through the plasma P'. These ionized sputter particles are efficiently extracted from the plasma P' and efficiently directed at the substrate 50 by the extraction-use electric field.

These ionized sputter particles efficiently arrive at the interior of a hole formed in the surface of the substrate 50, and this contributes to the deposition of a film with good bottom coverage inside the hole.

What is claimed is:

1. An ionizing sputtering device comprising:

a sputter chamber;

a target provided inside the sputter chamber;

a sputtering power source for magnetron sputtering the target to create sputter particles;

a substrate holder for holding a substrate in an incident position facing the target;

at least one supplemental electrode is provided so as to at least partially surround a flight path of the sputter particles defined between the target and the substrate holder, and is capacitively coupled to the target to form a capacitively coupled supplemental plasma in an inside of the supplemental electrode.

2. The ionizing sputtering device of claim 1, wherein the supplemental electrode is cylindrical.

3. The ionizing sputtering device of claim 1, wherein the supplemental electrode is defined by a plurality of angular rod-shaped members.

4. The ionizing sputtering device of claim 1, wherein a supplemental high-frequency power source is connected to the supplemental electrode for applying electric power to the supplemental electrode, the power to be applied to the supplemental electrode having the same frequency as the power to be applied to the target by the sputtering power source, wherein the supplemental electrode is maintained at a floating potential so that it is capacitively coupled with the target, and the supplemental plasma is formed, at least in part, by the high-frequency electric power applied to the target and to the supplemental electrode.

5. The ionizing sputtering device of claim 1, wherein the sputtering device further includes a magnetic field establishment device for setting up a magnetic field in order to trap plasma located on the inside of the supplemental electrode, and the magnetic field establishment device comprises a first magnetic body associated with the supplemental electrode and a second magnetic body associated with the substrate holder.

6. The ionizing sputtering device of claim 5, wherein at least a portion of the supplemental electrode is formed from a material having magnetic properties, the supplemental electrode forming at least a portion of the magnetic field establishment device.

7. The ionizing sputtering device of claim 1, wherein at least a surface of the supplemental electrode is made of a same material as the target in order to prevent contamination of the substrate.

8. The ionizing sputtering device of claim 1, wherein the sputtering device further includes an electric field establishment device for setting up an electric field perpendicular to the substrate, thereby pulling ions from an area inside of the supplemental electrode and directing them toward the substrate.

9. The ionizing sputtering device of claim 1, wherein the sputter chamber is equipped with an exhaust system for establishing a pressure within the sputter chamber of between 10 mTorr and 100 mTorr.

10. The ionizing sputtering device of claim 1, wherein the sputtering device further includes a magnetic field establishment means for establishing a magnetic field about the supplemental electrode to prevent diffusion of the supplemental plasma to an outside of the supplemental electrode.

11. The ionizing sputtering device of claim 1, wherein the sputtering power source creates a magnetron sputtering plasma for sputtering the target and wherein the capacitively coupled supplemental plasma formed by the supplemental electrode increases ionization of the sputter particles.

12. A method of sputtering a substrate held by a substrate holder within a sputter chamber comprising the steps of:

applying high-frequency electric power to a target thereby magnetron sputtering the target and creating sputter particles;

holding a substrate in an incident position facing the target;

surrounding a flight path of the sputter particles between the target and the substrate with a supplemental electrode; and forming a capacitively coupled supplemental plasma toward the inside of the supplemental electrode by capacitively coupling the supplemental electrode to the target.

13. The sputtering method of claim 12, wherein the supplemental electrode has a cylindrical shape.

14. The sputtering method of claim 12, wherein the supplemental electrode includes a plurality of angular rod-shaped members.

15. The sputtering method of claim 12, further comprising the steps of connecting a supplemental high-frequency power source to the supplemental electrode and applying electric power to the supplemental electrode and applying power to the supplemental electrode of the same frequency as the power applied to the target, maintaining the supplemental electrode at a floating potential so that it is capacitively coupled with the target, and the supplemental plasma being formed, at least in part, by application of the high-frequency electric power to the target and to the supplemental electrode.

16. The sputtering method of claim 12, further comprising setting up a magnetic field in order to trap plasma located on the inside of the supplemental electrode by associating a first magnetic body with the supplemental electrode, and associating a second magnetic body with the substrate holder.

17. The sputtering method of claim 16, further comprising forming at least a portion of the supplemental electrode from a material having magnetic properties, and forming at least a portion of the magnetic field with the supplemental electrode.

18. The sputtering method of claim 12, further comprising forming at least the surface of the supplemental electrode of the same material as the target in order to prevent contamination of the substrate.

19. The sputtering method of claim 12, further comprising setting up an electric field perpendicular to the substrate, thereby pulling ions from the area inside of the supplemental electrode and directing them toward the substrate.

20. The sputtering method of claim 12, further comprising establishing a pressure within the sputter chamber of between 10 mTorr and 100 mTorr.

21. The sputtering method of claim 12, further comprising establishing a magnetic field about the supplemental electrode to prevent diffusion of the supplemental plasma to an outside of the supplemental electrode.

22. The sputtering method of claim 12, wherein the step of applying high-frequency electric power to the target forms a magnetron sputtering plasma for sputtering the target and the supplemental plasma increases ionization of the sputter particles.

* * * * *